United States Patent [19]
Konno et al.

[11] 4,376,919
[45] Mar. 15, 1983

[54] CIRCUITRY FOR SWITCHING EFFECTIVE ELECTRODE AREA ON A CRYSTAL IN A CRYSTAL OSCILLATOR TO VARY THE OSCILLATION FREQUENCY

[75] Inventors: Tetsuro Konno, Tokyo, Japan; Tetsuro Konno, Tokyo, Japan

[73] Assignee: Seikosha Co., Ltd., Japan

[21] Appl. No.: 188,031

[22] Filed: Sep. 17, 1980

[30] Foreign Application Priority Data

Oct. 16, 1979 [JP] Japan ................................. 54-133937
Dec. 14, 1979 [JP] Japan ................................. 54-162267
Dec. 14, 1979 [JP] Japan ................................. 54-162267

[51] Int. Cl.³ .......................... H03B 5/32; H03L 1/02
[52] U.S. Cl. ..................................... 331/158; 310/315; 310/366; 331/163; 331/176; 331/177 R
[58] Field of Search ............. 331/116 R, 116 FE, 158, 331/163, 176, 177 R, 66, 179; 368/159; 310/315, 346, 365, 366

[56] References Cited

U.S. PATENT DOCUMENTS

3,568,093  3/1971  Ishida ............................... 331/158 X
4,184,095  1/1980  Stacchiotti et al. ................ 310/366

FOREIGN PATENT DOCUMENTS

2913798   10/1979  Fed. Rep. of Germany ...... 310/366
54-12287   1/1979  Japan ................................. 310/366
54-158839 12/1979  Japan ................................. 331/176
2007450    5/1979  United Kingdom ............ 331/177 R Primary Examiner—Siegfried H. Grimm
Attorney, Agent, or Firm—Robert E. Burns; Emmanuel J. Lobato; Bruce L. Adams

[57] ABSTRACT

An oscillator comprises plural electrodes formed on a piezoelectric vibrator, and the oscillation frequency is controlled by varying the duty factor of the pulses for switching an effective electrode area of the plural electrodes. The frequency-temperature characteristic of the oscillator is compensated by varying the duty factor of the switching pulses according to temperature variations.

No trimmer condenser is needed, and the frequency-temperature characteristic is compensated over a wide temperature range.

8 Claims, 15 Drawing Figures

CIRCUITRY FOR SWITCHING EFFECTIVE ELECTRODE AREA ON A CRYSTAL IN A CRYSTAL OSCILLATOR TO VARY THE OSCILLATION FREQUENCY

BACKGROUND OF THE INVENTION

The present invention relates to an oscillator employing a piezoelectric vibrator in which it is easy to control the oscillation frequency and to keep the oscillation frequency constant over a wide temperature range.

For example, in a crystal oscillator, a trimmer condenser is needed to control the oscillation frequency, and therefore the oscillator construction becomes complex. Also, the oscillation frequency drifts according to changes in the temperature, so the oscillator can be used only in a narrow temperature range. Even in an oscillator having a minimum frequency drifting rate, its oscillation frequency drifts about ±2 PPM in the temperature range 5° to 35° C., and out of this temperature range, the oscillation frequency drifts considerably.

SUMMARY OF THE INVENTION

A first object of the present invention is to provide an oscillator whose oscillation frequency is controlled easily, and without need of a trimmer condenser.

A second object of the present invention is to provide an oscillator whose oscillation frequency is very stable, in spite of switching the switching circuit for switching an effective electrode area of a piezoelectric vibrator.

A third object of the present invention is to provide an oscillator whose oscillation frequency is compensated in a wide temperature range, furthermore, most of the construction can be integrated in a C-MOS IC chip.

DESCRIPTION OF THE PREFERRED EMBODIMENTS

Figure 1:
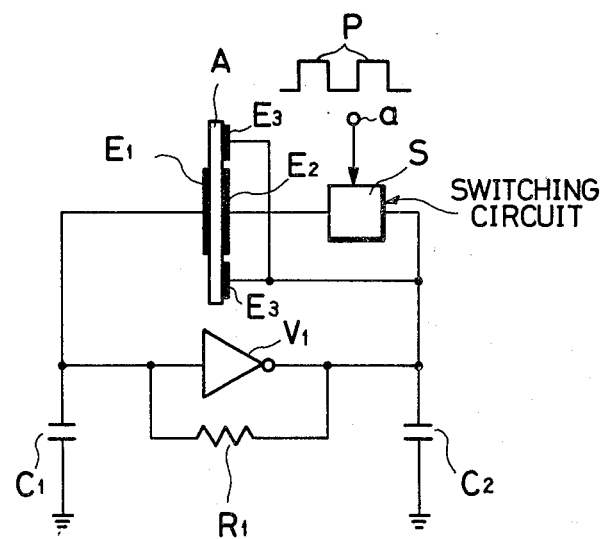
FIG. 1 shows an electric circuit for explaining the principle of the present invention.
Figure 2:
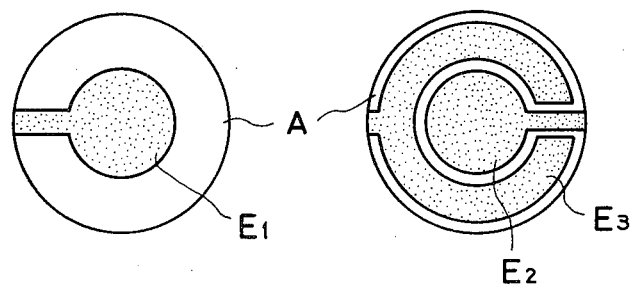
FIG. 2 shows a front view and a rear view of a piezoelectric vibrator according to an embodiment of the present invention.

An embodiment of the present invention is mentioned below with reference to the drawings. Referring to FIGS. 1 and 2, an electrode $E_1$ is formed on one major face of a quartz crystal resonator or vibrator A, and electrodes $E_2$, $E_3$ are formed on the other major face. The electrode $E_1$ is connected to a load capacitance $C_1$, the electrode $E_3$ is connected to a load capacitance $C_2$, and the electrode $E_2$ is connected to the load capacitance $C_2$ via a switching circuit S. Between the load capacitances $C_1$ and $C_2$, an inverter $V_1$ and a resistor $R_1$ are connected.

Figure 3:
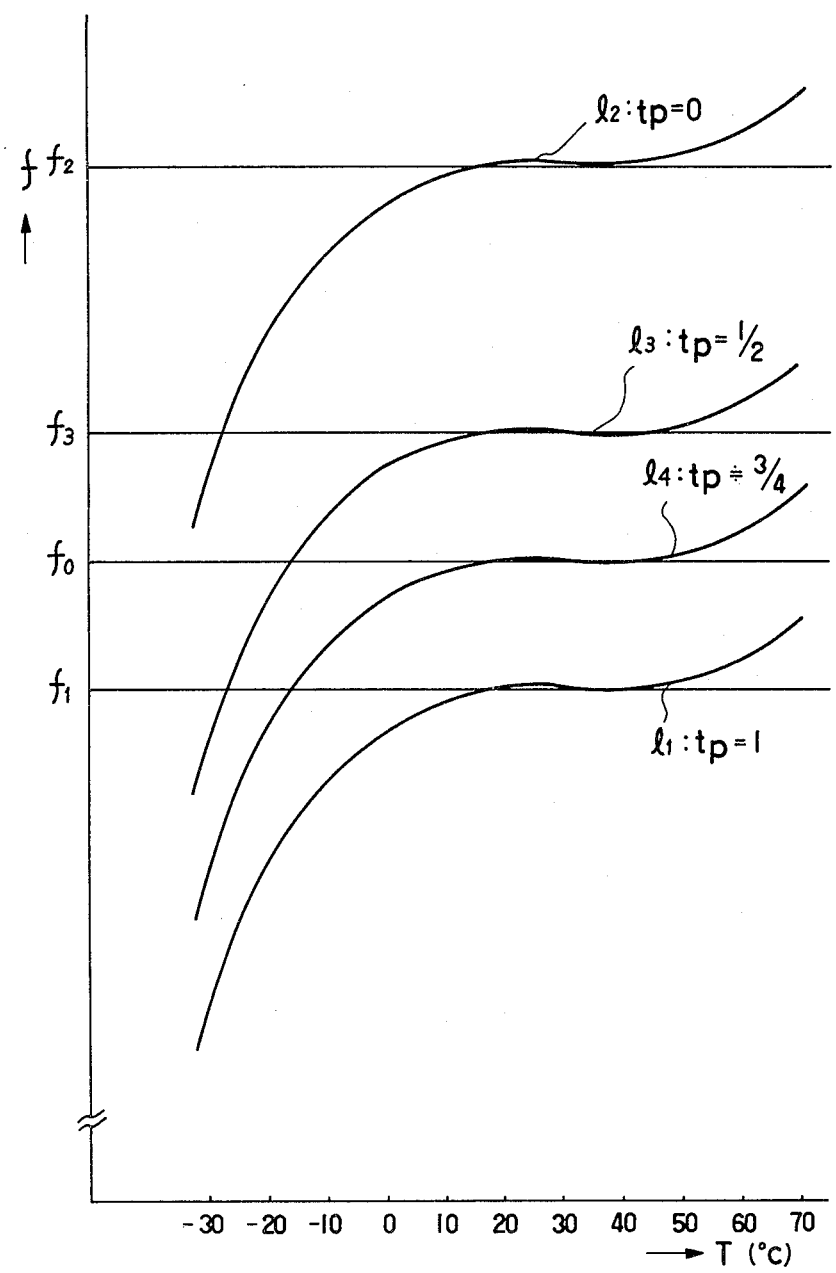
FIG. 3 is a frequency-temperature characteristic diagram of a piezoelectric vibrator corresponding to the duty factor of switching pulses.

In the aforementioned construction, when the duty factor $t_p$ of the switching pulses is 1, the switching circuit S is kept turned on, so the electrodes $E_2$ and $E_3$ are connected. In the above condition, the oscillation frequency $f_1$ at room or ambient temperature is predetermined so as to be lower than the objective frequency $f_0$, as shown by a curve $l_1$ in FIG. 3.

And, when the duty factor $t_p$ of the switching pulses is 0, the switching circuit S is kept turned off, so the electrode $E_2$ is cut off. In this condition, the oscillation frequency $f_2$ at room temperature is predetermined so as to be higher than the objective frequency $f_0$, as shown by a curve $l_2$ in FIG. 3.

Thereupon, the connection of the electrodes $E_2$ and $E_3$ is controlled by supplying the pulses P to the terminal a of the switching circuit S. Accordingly, the effective electrode area of the quartz oscillator A is switched, and the oscillation frequency can be controlled by the duty factor of the pulses P. For example, when the duty factor $t_p$ is fixed at $\frac{1}{2}$, the oscillation frequency at room temperature is controlled to the frequency $f_3$ which is between the frequency $f_1$ and $f_2$, as shown by a curve $l_3$ in FIG. 3. And, setting the duty factor $t_p$ at about $\frac{3}{4}$, the oscillation frequency at room or ambient temperature is adjusted to the objective frequency $f_0$, as shown by a curve $l_4$ in FIG. 3.

By way of explanation, the time constant $\tau c$ of the passive parts of the oscillator is formulized as follows.

$$\tau c \approx 2Q/\omega_0 \text{ (Q:Q value of the quartz oscillator,}$$
$$\omega_0 = 2\pi f, \text{ f:oscillation frequency)}$$

Accordingly, by predetermining the frequency fp of the switching pulses P to be extremely higher than $1/\tau c (fp > 1/\tau c)$, the frequency fp is negligible in the oscillation frequency spectrum of the quartz resonator. Namely, the stability of the oscillation frequency of the quartz resonator A is not lost by use of the switching circuit. So, the oscillation frequency is controlled by selection of the duty factor of the pulses P.

For example, when a quartz oscillator whose oscillation frequency is about 4.2 MHz and Q value is about $3 \times 10^5$ to $5 \times 10^5$ is used, by predetermining the frequency fp of the pulses P to about 10 KHz, the oscillation frequency is not influenced by the frequency fp, but the oscillation frequency is controlled by the duty factor of the pulses P.

Accordingly, the oscillation frequency can be adjusted by the duty factor of the pulses, without losing the stability of the oscillation frequency.

Figure 4:
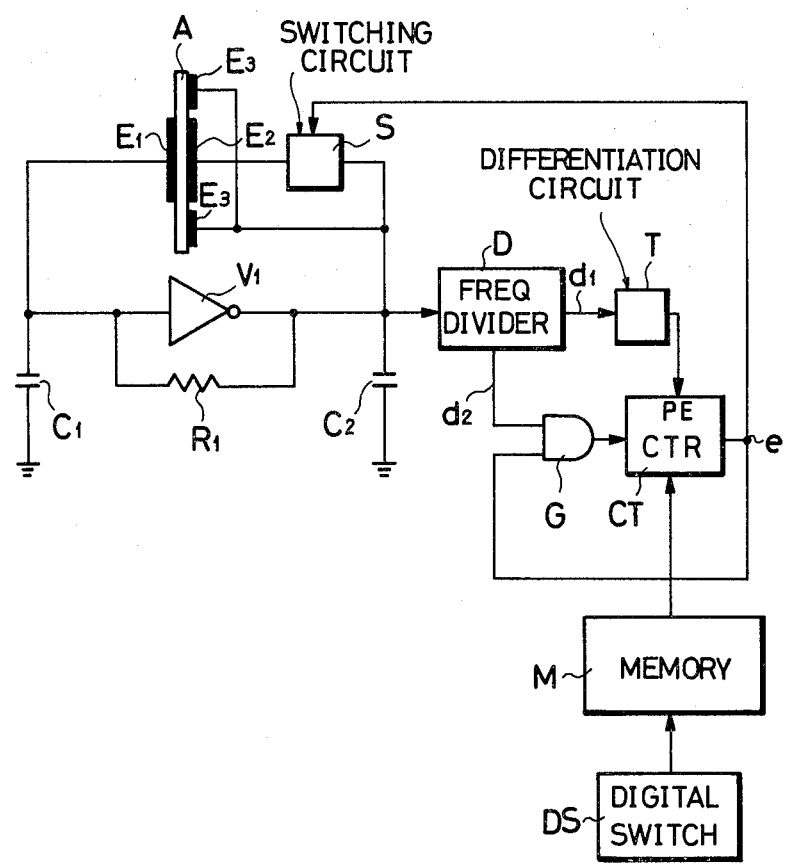
FIG. 4 shows an electric circuit according to one embodiment of the present invention.

In FIG. 4, the construction to set the duty factor of pulses P is represented. A frequency divider D divides the oscillation frequency, and the output frequencies from the terminals $d_1$, $d_2$ of the frequency divider are $\frac{1}{2}^n$, $\frac{1}{2}^m$ ($n > m$) of the oscillation frequency, respectively. A differentiation circuit T differentiates the output frequency from the terminal $d_1$, and the output pulses from the differentiation circuit T are supplied to the input terminal PE of a K(K=n−m) bits presettable-down counter CT. A gate circuit G receives the pulses from the terminal e of the counter CT, and the pulses from the terminal $d_2$ pass through the gate circuit G. The desired value is set by a digital switch DS, and it is memorized in a nonvolatile memory circuit M.

The operation of the above circuits is described below. By a pulse from the differentiation circuit T, the desired value memorized in the memory circuit M is preset in the down counter CT. Therefore, the terminal e turns to a logic value "1" (herein-after simply referred to a logic "1"), so the pulses from the terminal $d_2$ pass through the gate circuit G, and they are supplied to the down counter CT. And, the terminal e turns to a logic "0", when the down counter CT counts the desired value. Then, the content of the memory circuit M is preset again in the down counter CT by the next pulse from the terminal $d_1$, and the above-mentioned operation repeats again.

Consequently, from the terminal $d_1$, pulses having a duty factor corresponding to the value set by the digital switch DS are generated to control the switching of the switching circuit S. By such a construction, the effective electrode area is switched, and the oscillation frequency is effectively adjusted.

In FIG. 4, the construction except the digital switch DS, capacitances $C_1$, $C_2$ and the quartz resonator can be integrated, and a trimmer condenser is not needed, and thus the stability of the oscillation frequency is improved.

Figure 5:
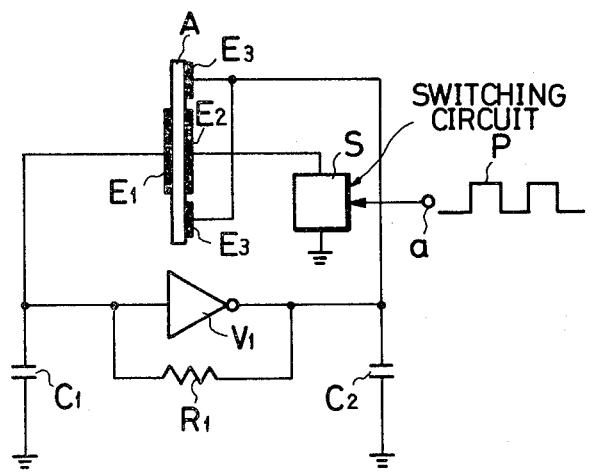
FIGS. 5, 6 and 7 show electric circuits according to the other embodiments of the present invention, respectively.
Figure 6:
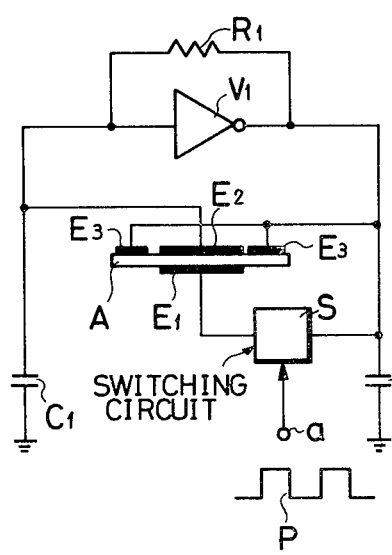
Figure 7:
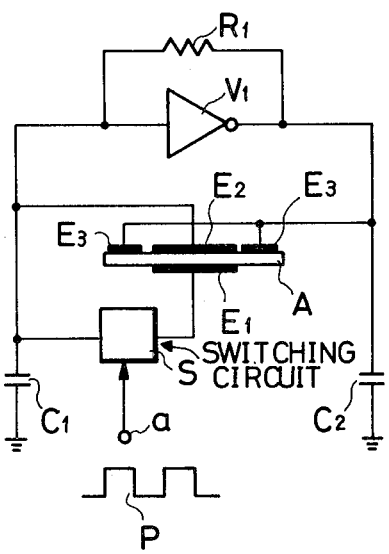

FIGS. 5 to 7 are other embodiments to switch the effective electrode area, respectively, and have the same operation and effect as the above-mentioned embodiment. In FIG. 5, when the switching circuit S turns on, the electrodes $E_1$, $E_2$ and $E_3$ constitute the effective electrodes.

In FIGS. 6 and 7, the effective electrode area is switched by switching the electrode $E_1$.

Next, an embodiment of the construction for achieving temperature compensation is explained below.

Figure 8:
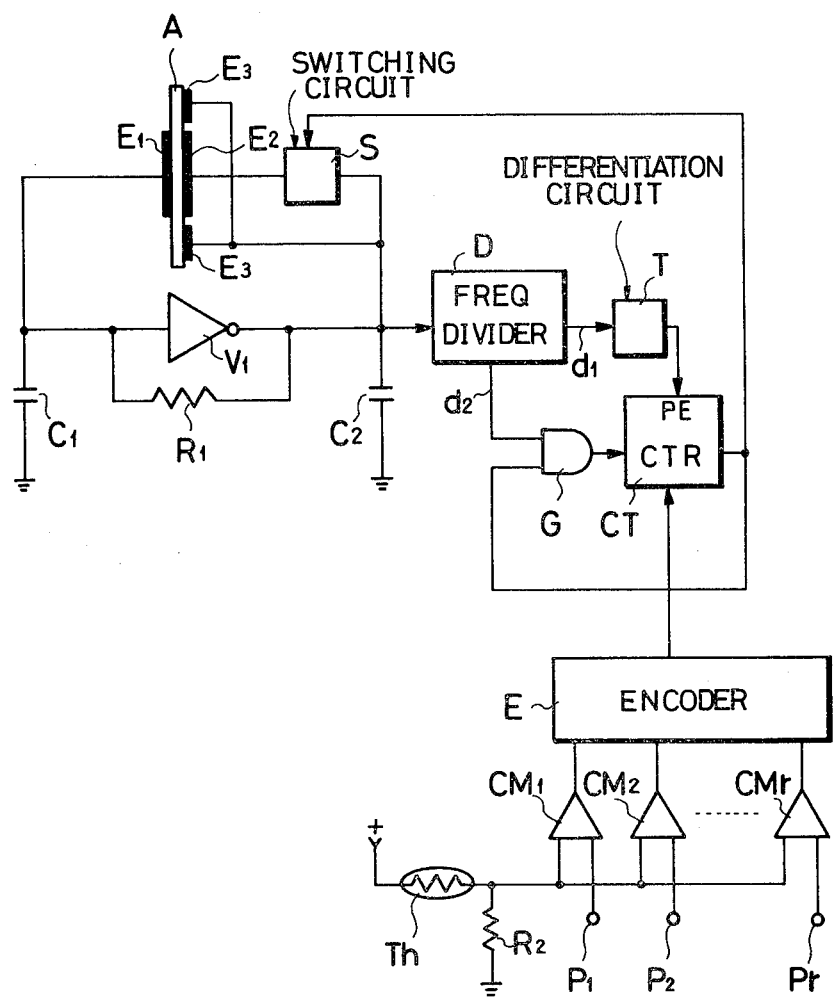
FIG. 8 shows an electric circuit for the temperature compensation according to an embodiment of the present invention.

In FIG. 8, the ambient temperature is converted to a voltage by a thermistor Th and a resistor $R_2$, and the voltage is supplied to comparison circuits $CM_1$ - - - $CM_r$. The terminals $P_1$ - - - $P_r$ of the comparison circuits $CM_1$ - - - $CM_r$ are maintained at predetermined to differential voltages respectively. The outputs from the comparison circuits $CM_1$ - - - $CM_r$ are converted to binary coded data by an encoder E, and the data is supplied to the down counter CT.

Consequently, the data corresponding to the temperature is preset in the down counter CT, namely, the duty factor of pulses for switching the switching circuit S is set. Therefore, the switching of the switching circuit S is controlled corresponding to the temperature, and the effective electrode area is switched accordingly, and the oscillation frequency is compensated to a wave-like line $l_5$ shown in FIG. 9. Accordingly, the frequency drifting rate can be controlled under ±1 PPM in a very wide temperature range −30° to +70° C.

Figure 10:
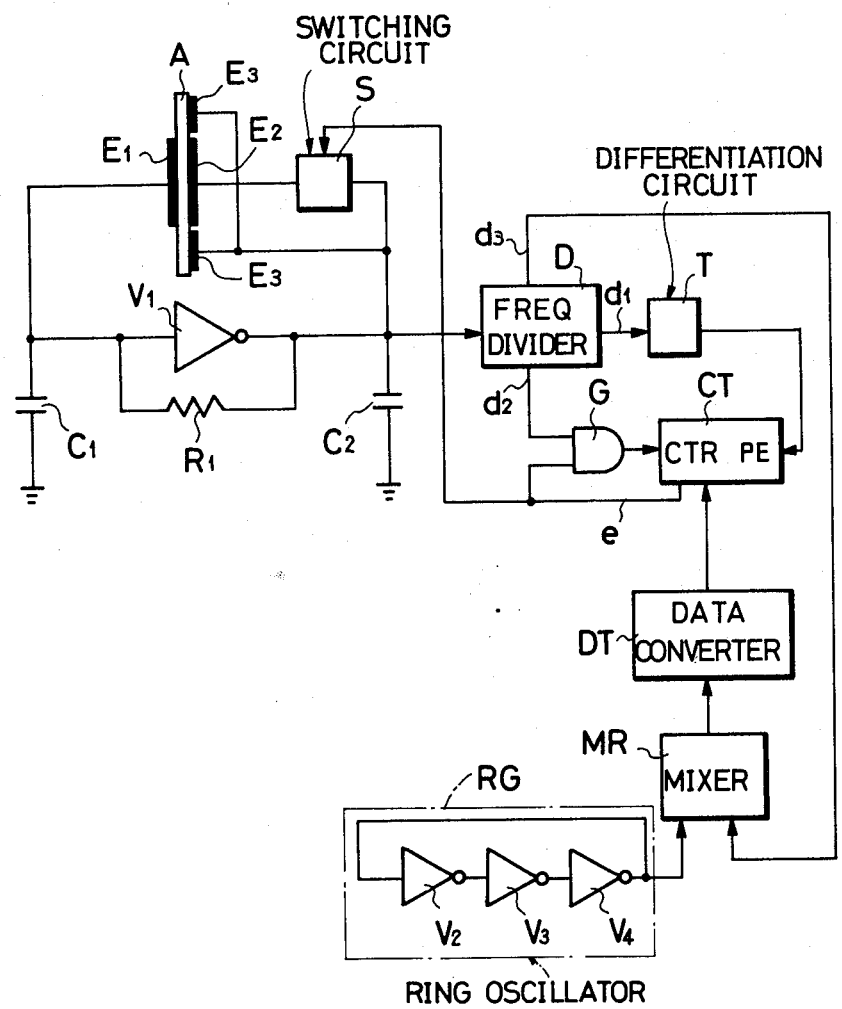
FIG. 10 shows an electric circuit according to another embodiment of the present invention.
Figure 11:
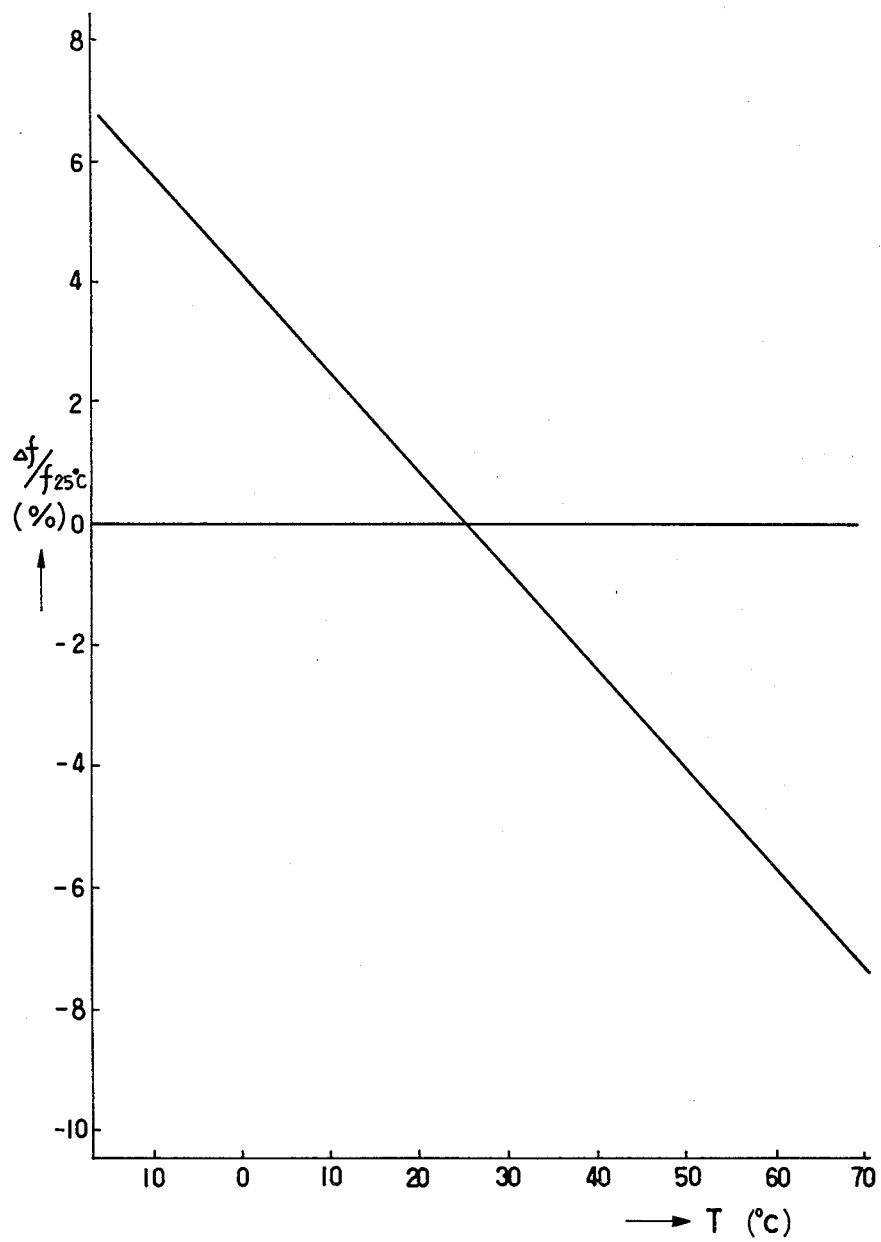
FIG. 11 is a frequency-temperature characteristic diagram of a ring oscillator in FIG. 10.

Next, referring to FIG. 10, another embodiment for effecting the temperature compensation is explained below. A ring oscillator RG is composed of C-MOS inverters $V_2$, $V_3$, $V_4$, and its output frequency is supplied to a mixer MR. A difference frequency between the output frequency of the ring oscillator RG and the frequency from a terminal $d_3$ is supplied to the data converter DT. The frequency-temperature characteristic of the ring oscillator is nearly linear as shown in FIG. 11. At the vertical axis in FIG. 11, the frequency drifting rate $\Delta f/f_{25°\,C.}$ ($f_{25°\,C.}$; oscillation frequency at 25° C., $\Delta f = f_{T°C.} - f_{25°\,C.}$, $f_{T°C.}$; oscillation frequency at T°C.) is shown.

As the oscillation frequency of the ring oscillator RG drifts linearly according to change in the temperature, the output frequency from the mixer MR varies according to the temperature. And it is converted to binary coded data by the data converter DT, and the data is supplied to the down counter CT.

Figure 9:
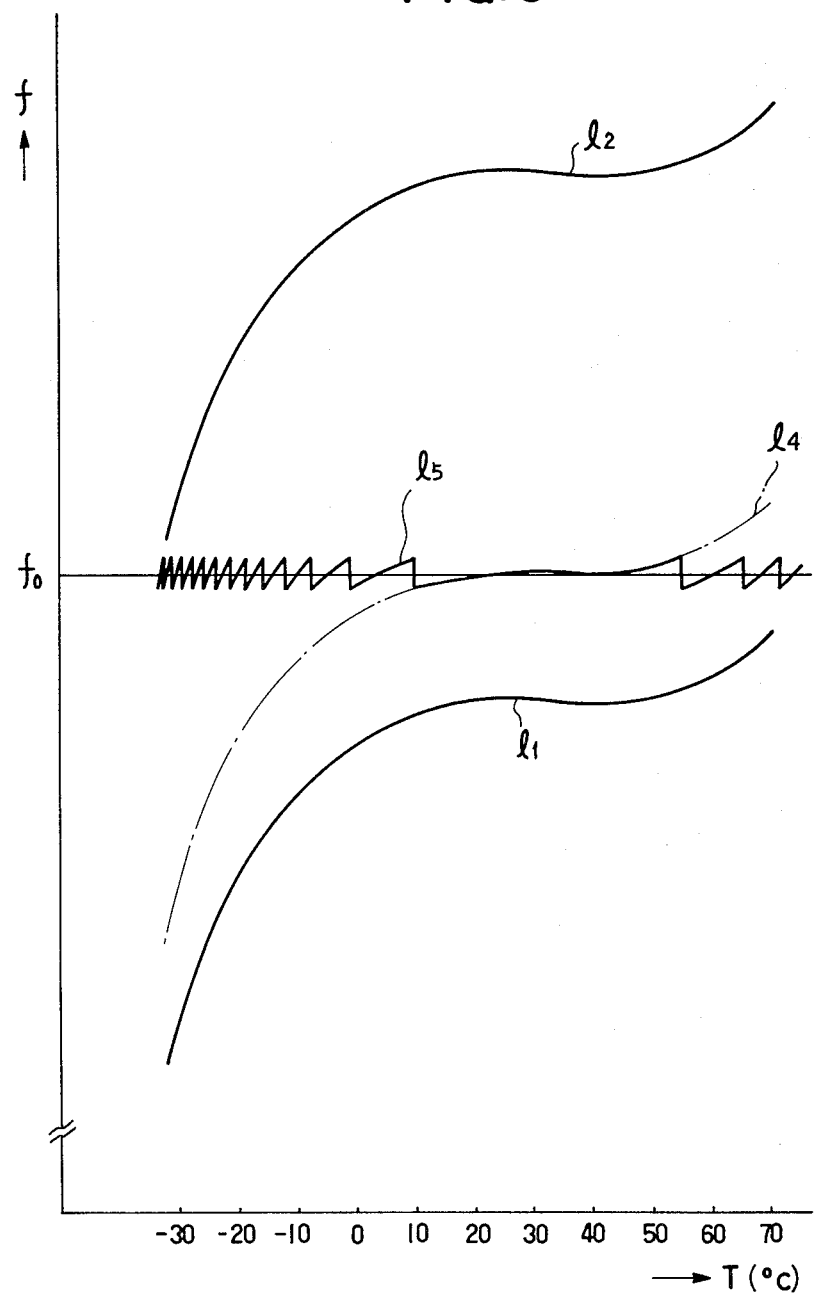
FIG. 9 is a frequency-temperature characteristic diagram before and after the temperature compensation by the electric circuit in FIG. 8.

Consequently, the oscillation frequency of the quartz oscillator Q is compensated as shown in FIG. 9. Moreover, the construction except the quartz resonator Q and the capacitances $C_1$, $C_2$ can be integrated in a C-MOS IC chip.

Figure 12:
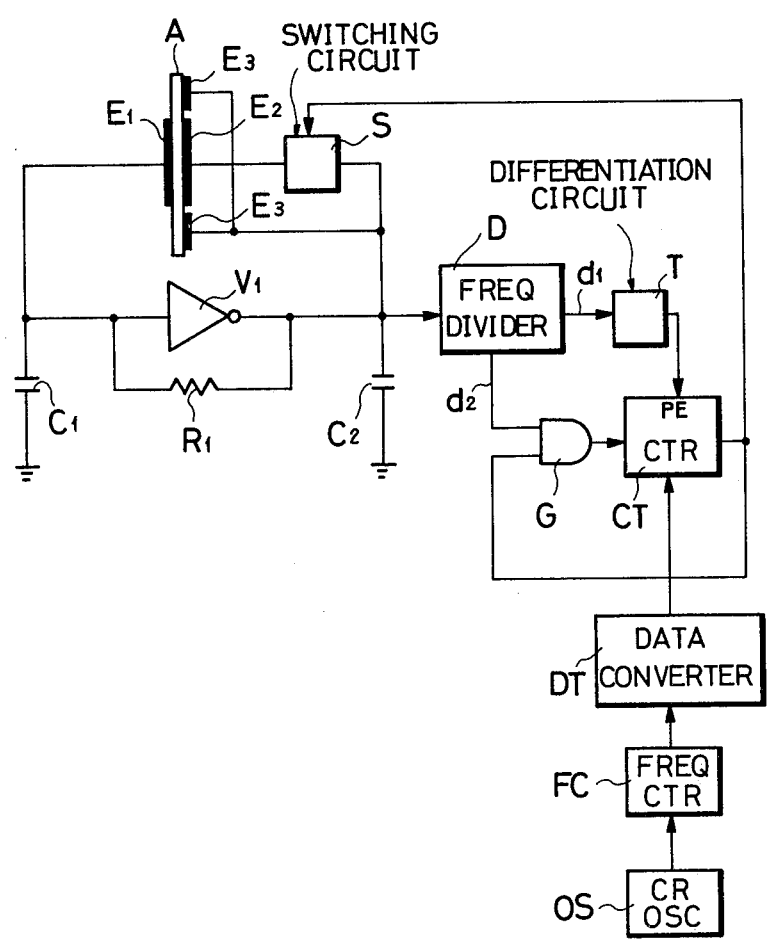
FIG. 12 shows an electric circuit according to a further embodiment of the present invention.

Further, another embodiment is shown in FIG. 12. The oscillation frequency of a CR oscillator OS which has a thermistor, is counted by a frequency counting circuit FC, and its content is converted to the binary coded data by the data converter DT. The oscillation frequency of the CR oscillator OS drifts according to change in the temperature, so the data from the data converter varies according to the temperature.

Figure 13:
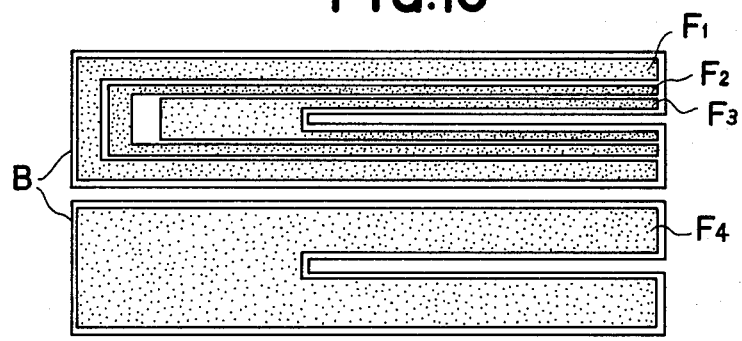
FIG. 13 shows a front view and a rear view of a piezoelectric vibrator according to another embodiment of the present invention.

Next, an embodiment is explained below, using a quartz resonator B having a tuning fork shape as shown in FIG. 13 whose frequency-temperature characteristic presents a quadric curve. Electrodes $F_1$, $F_2$ and $F_3$ are formed on one major face of the quartz resonator B, and a electrode $F_4$ is formed on the other major face.

Figure 14:
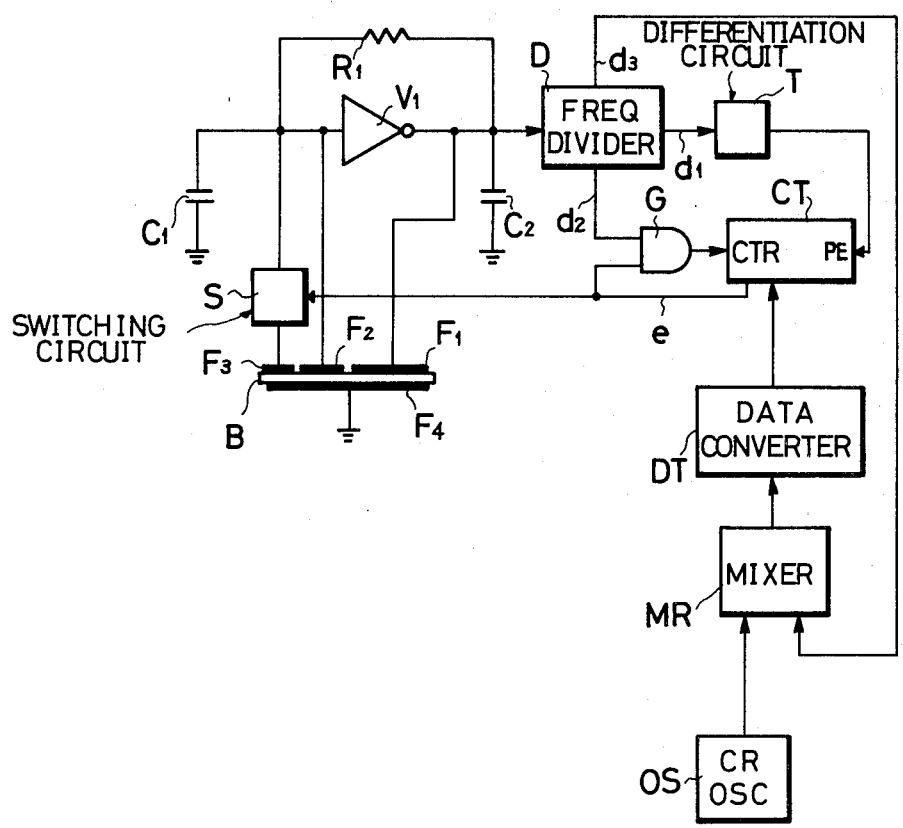
FIG. 14 shows an electric circuit for the temperature compensation of the piezoelectric vibrator in FIG. 13; and, FIG. 15 is a frequency-temperature characteristic diagram before and after the temperature compensation by the electric circuit in FIG. 14.
Figure 15:
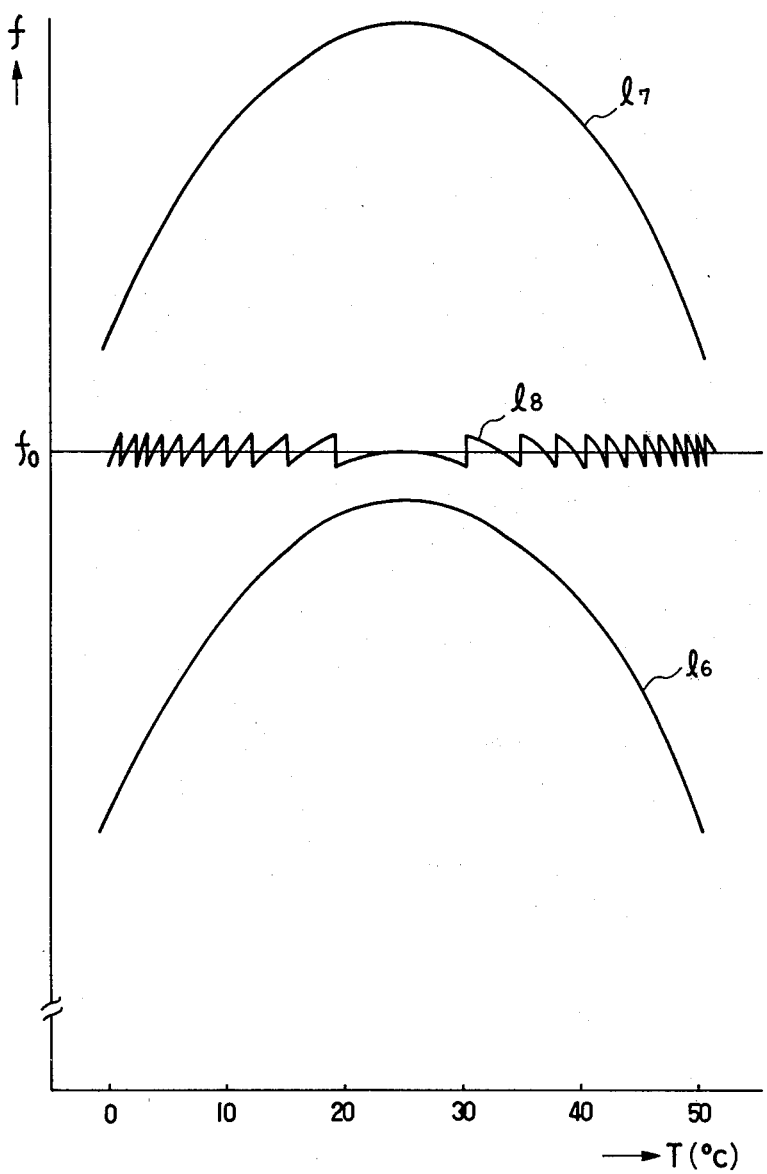

As shown in FIG. 14, the electrode $F_3$ is switched by the switching circuit S. Thereupon, it is predetermined that the maximum oscillation frequency is lower than the objective frequency $F_0$, as shown by a curve $l_6$ in FIG. 15, when the switching circuit S is kept turned on. Further, it is predetermined that the oscillation frequency is higher than the objective frequency $f_0$ in the compensating temperature range, as shown by a curve $l_7$ in FIG. 15, when the switching circuit S is kept turned off.

The oscillation frequency of the CR oscillator OS and the output frequency from the terminal $d_3$ are supplied to the mixer MR, and the difference frequency is converted to binary coded data by the data converter DT. The oscillation frequency of the CR oscillator OS is predetermined so as to be coincident with the frequency from the terminal $d_3$ at 25° C. namely at the center line of the quadric curve $l_3$ in FIG. 15. Therefore, the difference frequency from the mixer MR is 0 at 25° C. and drifts symmetrically according to increase and decrease of the temperature. Consequently, the frequency-temperature characteristic can be compensated under ±1 PPM in a very wide temperature range, as shown by a wave-like line $l_8$.

According to the present invention as described above, the effective electrode area is switched by the switching pulses which have a variable duty factor. Therefore, the oscillation frequency can be adjusted by controlling the duty factor of the switching pulses, a trimmer condenser is not needed, and the frequency stability is improved.

Further, since the switching pulses are generated from a frequency divider which divides the oscillation frequency, the oscillation frequency and the switching pulses are not influenced by the aging phenomenon.

In addition, since the duty factor of the switching pulses is varied according to the temperature, the oscillation frequency can be compensated and be kept stable in a wide temperature range.

What we claim is:

1. A circuit for switching the effective electrode area on a crystal resonator in a crystal oscillator to vary the oscillation frequency, comprising:
   a crystal resonator suitable for use as a frequency standard;
   plural electrodes on the surface of said crystal resonator jointly defining an electrode area;
   pulse generator means for generating pulses having a variable duty factor; and
   switching circuit means responsive to the pulses for switching the effective electrode area on the crystal resonator for controlling the oscillation frequency of said crystal resonator.

2. A circuit according to claim 1; wherein said pulse generator means comprises
   a frequency divider for dividing the output frequency of said crystal resonator, and
   control circuit means for controlling the pulse width of the output pulses from said frequency divider to accordingly control the switching of said effective electrode area.

3. A circuit for switching the effective electrode area on a crystal resonator in a crystal oscillator to vary the oscillation frequency, comprising:
   a crystal resonator suitable for use as a frequency standard;
   plural electrodes on the surface of said crystal resonator jointly defining an electrode area;
   pulse generator means for generating pulses having a duty factor which varies according to the ambient temperature; and
   switching circuit means responsive to the pulses for switching the effective electrode area on the crystal resonator for controlling the oscillation frequency of said crystal resonator.

4. A circuit according to claim 3; wherein said pulse generator means comprises
   a ring oscillator comprised of C-MOS inverters connected in a circle,
   a frequency divider for dividing the oscillation frequency of said crystal resonator, and
   control circuit means for controlling the pulse width of the pulses from said frequency divider so as to switch said effective electrode area according to the oscillation frequency of said ring oscillator.

5. A circuit according to claim 3; wherein said pulse generator means comprises
   a CR (condensor-resistor) oscillator having a thermistor for varying the oscillation frequency of the CR oscillator according to the ambient temperature,
   a frequency divider for dividing the oscillation frequency of the output frequency of said crystal resonator, and
   control circuit means for controlling the pulse width of the pulses from said frequency divider so as to switch said effective electrode area according to the oscillation frequency of said CR oscillator.

6. In combination: a crystal oscillator comprising a piezoelectric crystal resonator oscillatable at an oscillation frequency suitable for use as a frequency standard, a plurality of electrodes disposed on surfaces of the crystal resonator and jointly defining an electrode area, and circuit means for applying voltage to the plurality of electrodes to drive the crystal resonator to oscillate; pulse generating means for generating pulses having a variable duty factor; and switching means for switching at least one of the plurality of electrodes into and out of connection with the circuit means as a function of the pulse duty factor to thereby vary the effective electrode area and accordingly vary the oscillation frequency of the crystal resonator.

7. The combination according to claim 6; wherein the pulse generating means comprises a frequency divider for dividing the output frequency of the crystal resonator and producing frequency-divided output pulses, and means for controlling the pulse width of the frequency-divided output pulses to obtain pulses having a variably selectable duty factor.

8. The combination according to claim 6; wherein the pulse generating means includes means for generating pulses having a duty factor which varies as a function of the ambient temperature.

* * * * *